(12) United States Patent
Kowalski (10) Patent No.: US 6,212,105 B1
(45) Date of Patent: Apr. 3, 2001

(54) METHOD FOR RECORDING A BINARY WORD BY MEANS OF ELECTRICALLY ERASABLE AND PROGRAMMABLE TYPE MEMORY CELLS

(75) Inventor: Jacek Kowalski, Trets (FR)

(73) Assignee: Inside Technologies, Saint Clement les Places (FR)

( * ) Notice: Subject to any disclaimer, the term of this patent is extended or adjusted under 35 U.S.C. 154(b) by 0 days.

(21) Appl. No.: 09/523,048

(22) Filed: Mar. 10, 2000

Related U.S. Application Data (63) Continuation of application No. PCT/FR98/01910, filed on Sep. 7, 1998.

(30) Foreign Application Priority Data

Sep. 10, 1997 (FR) .................................................. 97 11209

(51) Int. Cl.$^7$ .............................. G11C 16/06; G11C 7/00
(52) U.S. Cl. ................................ 365/189.04; 365/185.09; 365/185.22
(58) Field of Search ......................... 365/189.04, 185.09, 365/185.22, 185.29

(56) References Cited

U.S. PATENT DOCUMENTS

| | | |
|---|---|---|
| 4,517,663 | 5/1985 | Imazeki et al. ....................... 365/222 |
| 5,286,415 | 2/1994 | Buckley et al. ...................... 252/502 |
| 5,414,664 * | 5/1995 | Lin et al. ............................. 365/218 |
| 5,473,564 * | 12/1995 | Kowalski ......................... 365/185.1 |
| 5,801,991 * | 9/1998 | Keeney et al. ................... 365/185.23 |

FOREIGN PATENT DOCUMENTS

| | | |
|---|---|---|
| 0 067 364 A2 | 12/1982 | (EP) . |
| 0 618 591 A1 | 10/1994 | (EP) . |
| 8-044832 | 2/1996 | (JP) . |
| WO97/30454 | 8/1997 | (WO) . |

* cited by examiner

Primary Examiner—Son Mai
(74) Attorney, Agent, or Firm—Akin, Gump, Strauss, Hauer & Feld, L.L.P.

(57) ABSTRACT

The present invention relates to a method for recording a binary word (BW) by means of electrically erasable and programmable type memory cells ($C_{i,j}$) organized in word lines ($Wl_i$), in which there are provided at least two word lines ($WL_i$, $XWL_i$) that can be erased or programmed independently of each other, the binary word is recorded in one of said word lines ($XWL_i$) and, simultaneously, the other word line ($XWL_i$) is erased. The invention is applied to the making of a memory system (10), a binary counter and an abacus counter that are secured.

11 Claims, 6 Drawing Sheets

FIG. 1

(Prior Art)

METHOD FOR RECORDING A BINARY WORD BY MEANS OF ELECTRICALLY ERASABLE AND PROGRAMMABLE TYPE MEMORY CELLS

This application is a continuation of PCT/FR1998/01910, filed Sep. 7, 1998.

The present invention relates to EEPROM type memories (electrically erasable and programmable read-only memory).

In recent years, EEPROM type memories have undergone major development because of their advantageous characteristics. Indeed, these memories can be programmed or erased at will by the application of a high voltage Vpp, generally of 15 to 20 volts. Once programmed, they retain a piece of information indefinitely without having any electrical power supply. Owing to these properties, EEPROM type memories are the preferred means for recording identification data or transaction data in integrated circuits mounted on portable carriers such as, for example, the integrated circuits of chip cards or electronic tags.

However, integrated circuits of this kind are generally not protected against untimely cuts in supply voltage Vcc, which may occur at any time as the result of a handling error by the user (for example the fact of suddenly removing a chip card from the reader in which it is inserted) or poor power reception (especially when the supply voltage Vcc is received by electromagnetic induction).

Since the high programming or erasure voltage Vpp is generally produced from the supply voltage Vcc, an untimely cut in the voltage Vcc during a recording operation may lead to a loss of data during recording.

Indeed, the recording of a binary word in an EEPROM memory requires a step of erasing the previously recorded word and then a step of recording the new word by programming the cells of the memory at 0. This particular feature of a two-step recording is well known to those skilled in the art and is inherent in the internal arrangement, in word lines, of the memory cells where the cells of one and the same word line can be individually programmed at 0 but have to be erased collectively. It may be recalled that the programmed state of an electrically erasable and programmable memory cell is considered by convention to be the logic "0" and corresponds to the absence of electrons in a floating gate. The erased state corresponds to the logic "1" and to the storage of electrons in a floating gate.

Thus, for example, the recording of the word M equal to 00110101 at a memory address comprising the previous word M equal to 01001101 entails, first of all, the erasure of the previous word so that M is equal to 11111111 and then the programming at 0 of the bits with the place values 1, 3, 4 and 7 so that M is equal to 00110101.

In general, the supply voltage Vcc may get cut off during the recording of a binary word:

1) during the erasure of the previous word (entailing the risk of the recording of wrong data), 2) during the programming at 0 of the bits of the new word (with the risk of the recording of wrong words), 3) after the erasure of the previous word and before the programming at 0 of bits of the new word (in which case the new word as well as the previous word are irretrievably lost).

In the patent application WO 97/48100, the Applicant proposes an advantageous method to complete a programming or erasure operation in progress when there is a cut in the supply voltage Vcc. Briefly, this method consists firstly in maintaining the high voltage Vpp by a capacitor charge and, secondly, in maintaining the various electrical paths that lead the voltage Vpp to the memory cells. However, this method relates to cases 1) and 2) above and, in the case 3), does not make it possible to recover the lost word and carry out a programming operation.

Furthermore, in microprocessor-based integrated circuits, there are known ways of providing for a complex memory back-up system in software form that can be used to restore the memory in the event of a power cut. However, it is not possible, with this method, to recover the word that should have been recorded in the memory after the erasure of the former word. Furthermore, this method cannot be applied to wired-logic integrated circuits having no microprocessor (namely circuits such as memory cards, electronic tags, etc.). In these circuits, the problem is not managed and is considered to be an inherent drawback in the use of EEPROMs.

Finally, the application EP 618 591 and its equivalent U.S. Pat. No. 5,473,564 describe a method that bring into play an auxiliary cell associated with each word line of an "abacus" type of memory counter. The auxiliary cell makes it possible, after a cut in the supply voltage, to know that a bit of a most significant line has been programmed at 0 but that the line with a lower place value has not been properly erased at 1. This method specifically relates to the abacus-type counters of prepayment cards and does not resolve the general technical problem explained here above.

Thus, it is a goal of the present invention to provide for an EEPROM method and system making it possible to record a binary word in a secured manner with respect to the risks of a cut in the supply voltage.

Another goal of the present invention is to make it possible for this method and system to be implemented in a wired-logic circuit having no microprocessor.

Furthermore, the technical problem explained here above relates also to data counters made out of electrically erasable and programmable memory cells, for example memory card unit counters.

Thus, yet another goal of the present invention is to provide for a method and counter for the secured recording of a counting data element.

To achieve these goals, the idea of the invention is to provide for a method of fast recording in a single step that does not require the erasure of a word line before the recording of a binary word or a counting data element.

More particularly, the present invention proposes a method for recording a binary word by means of electrically erasable and programmable type memory cells organized in word lines, comprising a preliminary step of providing for at least two word lines that can be erased or programmed independently of each other and a first recording step comprising the steps of simultaneously selecting the two word lines, programming all or part of the memory cells of one of the word lines as a function of the binary word to be recorded and simultaneously erasing the other word line.

According to one embodiment, the method comprises a second recording step comprising the steps of simultaneously selecting the two word lines, erasing the word line programmed during the first recording step, programming all or part of the memory cells of the other word line as a function of the binary word to be recorded.

According to one embodiment, a first word line is selected in a first electrically erasable and programmable memory and a second word line is selected in a second electrically erasable and programmable memory.

According to one embodiment, the first and second memories comprise one and the same number of word lines and the two word lines are selected simultaneously in each of the memories by means of the same address.

According to one embodiment, one of the memories comprises a number of word lines smaller than the number of word lines of the other memory and the two word lines are selected simultaneously, in each of the memories, by means of the same address.

According to one embodiment, an electrically erasable and programmable warning cell is associated with each of the word lines of a memory, the warning cell of a word line is erased when the word line is programmed and the warning cell of a word line is programmed when the word line is erased.

According to one embodiment, the first recording step is performed alternately, at each new recording of a binary word, in one or the other of the word lines.

According to one embodiment, the binary word is a counting data element, the word lines are counting lines together forming a counter, the recording of a new counting data element is preceded by a step of comparing the new counting data element with a previously recorded counting data element, and the recording of the new counting data element is done only if the new counting data element is not different from the previous counting data element in to an authorized sense of modification of the counter.

The present invention also relates to an electrically erasable and programmable memory system comprising at least two memories each comprising at least one word line, means for simultaneously selecting a word line in each of the memories, from a selection address, and wired logic means arranged to receive a binary word to be recorded and, upon reception of a write signal, to program all or part of the memory cells of one of the selected word lines, as a function of the binary word to be recorded, and to simultaneously erase the other word line.

According to one embodiment, the system comprises electrically erasable and programmable warning cells associated with the word lines of at least one memory, and means to program the warning cell of a word line when the word line is erased and to erase the warning cell of a word line when the word line is programmed.

According to one embodiment, the system comprises means for automatically selecting a word line whose warning cell is not erased and for the programming of the selected word line as a function of a word to be recorded when a programming voltage is applied to it.

The present invention also relates to a binary counter for the storage of a counting data element comprising at least one first electrically erasable and programmable counting line and one second electrically erasable and programmable counting line capable of being selected simultaneously but programmed or erased independently of each other, means to record each new counting data element alternately in the first counting line or the second counting line and to simultaneously erase the counting line comprising the former counting data element.

According to one embodiment, the counter comprises means for comparing each new counting data element to be recorded with a previously recorded counting data element, arranged to prevent the recording of the new counting data element if it is smaller or greater, according to a predetermined sense of modification of the counter, than the former counting data element.

According to one embodiment, the comparison means are arranged for the bit-by-bit comparison of the new counting data element to be recorded with the previously recorded counting data element, beginning with the most significant bits.

According to one embodiment, the counter comprises means for simultaneously reading the two counting lines.

The present invention also relates to an abacus type counter for the storage of the binary words with increasing place values, comprising a plurality of electrically erasable and programmable counting lines with increasing place values, characterized in that the lines are arranged so that each line can be programmed or erased simultaneously with the erasure or programming of the counting line with the immediately lower place value.

According to one embodiment, the counter comprises means for recording a counting data element in a counting line and the simultaneous erasure of the counting line with the immediately lower place value.

According to one embodiment, the lines are arranged in groups of parallel lines, each line of a given rank of a group of parallel lines being arranged in series with the same-ranking lines of the other groups.

These as well as other characteristics and advantages of the present invention shall be explained in greater detail in the following description of the method of the invention, various embodiments of a memory system according to the invention and various embodiments of unit counters according to the invention, with reference to the appended figures of which.

Figure 1:
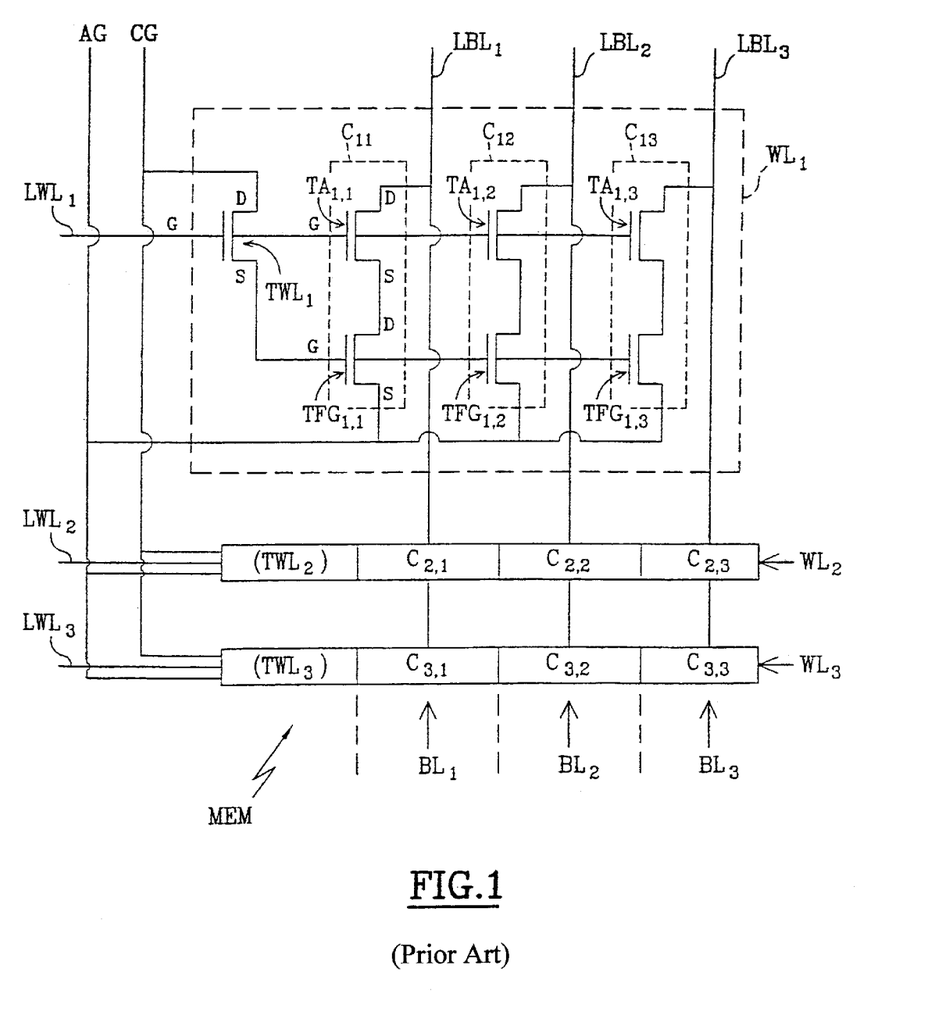
FIG. 1 is an electrical diagram of a standard EEPROM.

As a reminder, FIG. 1 shows the architecture of an electrically erasable and programmable memory MEM. The memory MEM comprises cells $C_{i,j}$ arranged in word lines $WL_i$ (horizontal rows) and bit lines $BL_j$ (vertical lines or columns), "i" being a word line index and "j" being a bit line index. For the sake of simplicity, the memory MEM shown has only nine cells $C_{i,j}$ forming three word lines WL1, WL2, WL3 and three bit lines BL1, BL2, BL3, the word line WL1 being shown in detail.

Each memory cell $C_{i,j}$ comprises an access transistor $TA_{i,j}$ and a floating-gate transistor $TFG_{i,j}$ connected by its drain D to an access transistor $TA_{i,j}$. The sources S of all the transistors $TFG_{i,j}$ are connected to a common control wire AG (or conductive track). The gates G of the floating-gate transistors $TFG_{i,j}$ of one and the same word line $WL_i$ (same index i) are connected to the source S of a transistor $TWL_i$ for selecting the word line $WL_i$. The drains D of the transistors $TWL_i$ for selecting the word lines are connected to a common control wire CG. The gates G of the access transistors $TA_{i,j}$ of one and the same word line $WL_i$ as well as the gate G of the selection transistor $TWL_i$ of the word line are connected to a wire $LWL_i$ for selecting the word line $WL_i$. The drains D of the access transistors $TA_{i,j}$ of one and the same bit line $BL_j$ (same index j) are connected to a wire $LBL_j$ for access to the bit lines $BL_j$.

Conventionally, the erasure of a word line $WL_i$ necessitates the following steps:

- application of a high voltage Vpp to the wire $LWL_i$ for selecting the word line $WL_i$ to be erased,
- application of the voltage Vpp to the control wire CG,
- ground connection of the control wire AG,
- access wires $LBL_j$ may be left at a floating potential, or may be connected to the ground.

In this case, the floating-gate transistors $TGF_{i,j}$ of the word line $WL_i$ selected receive the voltage Vpp at their gate G and the ground at their source S. Electrical charges are injected by tunnel effect into the floating gates, so that the transistors then have a negative threshold voltage VT and are naturally in the off state during a reading of the memory. The erased state of the transistors, namely the naturally off state, is conventionally considered to be the logic "1" state.

Furthermore, the programming of the memory cells $C_{i,j}$ of a word line $Wl_i$ requires the following operations:

- the application of the high voltage Vpp to the wire $LWL_i$ for selecting the word line $WL_i$ comprising cells $C_{i,j}$ to be programmed,
- the ground connection of the control wire CG,
- the control wire AG is taken to a floating potential,
- the application of the voltage Vpp to the wires $LBL_j$ providing access to the bit line $BL_j$ comprising cells that have to be programmed.

In this case, the floating-gate transistors $TFG_{i,j}$ that belong to the selected word line $WL_i$ and have their access transistors $TA_{i,j}$ connected to wires $LBL_j$ receiving the voltage Vpp receive the voltage Vpp at their drain D and have their gate G connected to the ground. Electrical charges are liberated from the floating gates. The transistors then show a positive threshold voltage VT and are naturally in the on state during an operation of reading of the memory. The programmed state of the transistors, namely their naturally on state, is considered to be the logic "0". The other transistors $TFG_{i,j}$ of the selected word line $WL_i$ that do not receive the voltage Vpp at their drain D remain in their initial state which is erased or programmed.

Thus, as indicated in the preamble, the programming of cells of the memory may be done individually while the erasure is collective for a word line. The recording of a binary word in the memory therefore requires a first step of erasing a word line $WL_i$ followed by a second step of recording the word by the programming at 0 of certain bits of the word line, chosen as a function of the word to be recorded.

First Embodiment of the Invention

Figure 2:
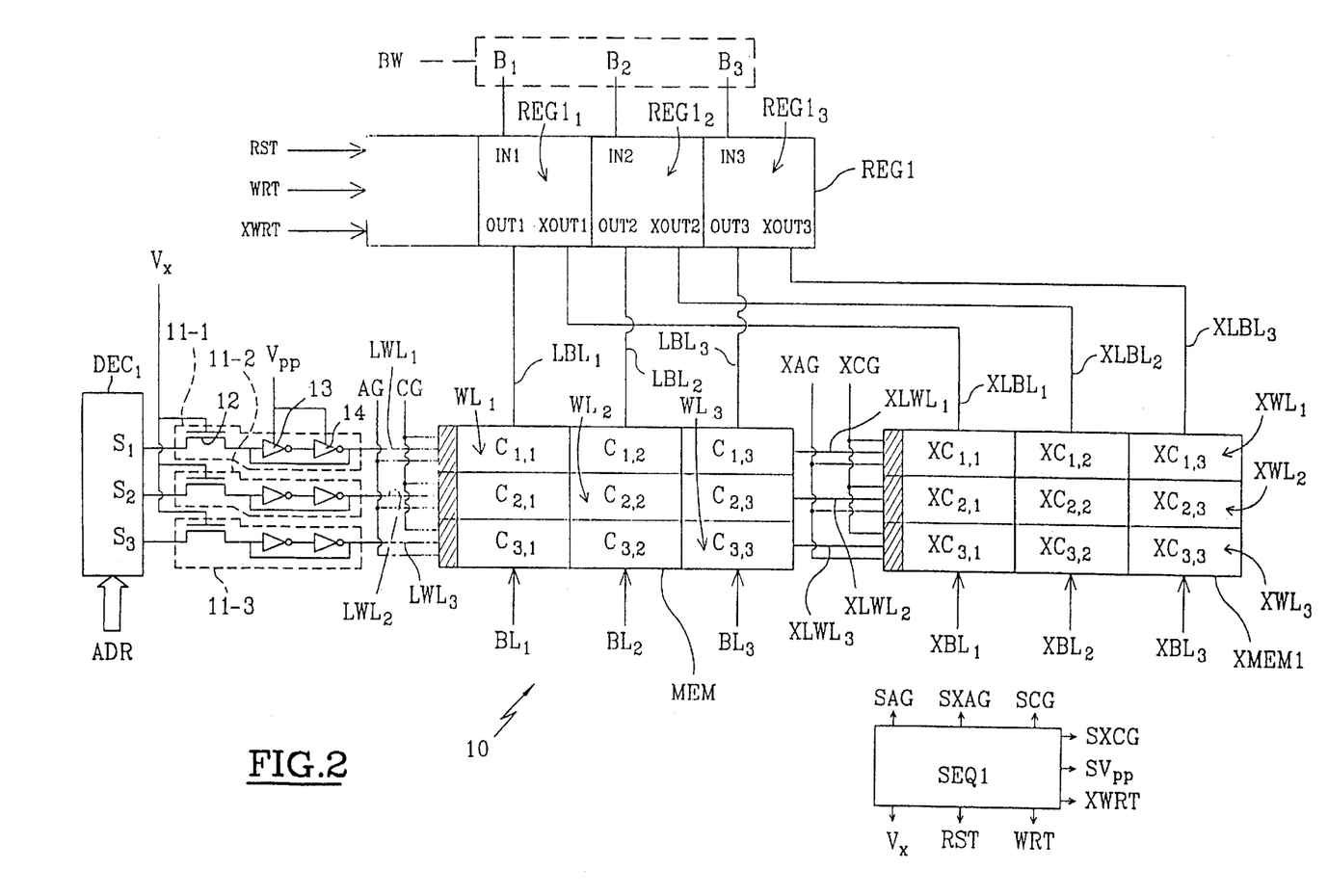
FIG. 2 is an electrical diagram of a first embodiment of an EEPROM system according to the invention.

FIG. 2 shows a memory system 10 according to the invention. The system 10 comprises the memory MEM that has just been described and an auxiliary memory XMEM1, which herein has the same structure as the memory MEM. The memory XMEM1 comprises cells $XC_{i,j}$, arranged in three word lines $XWL_i$ and three bit lines $XBL_j$, control wires XAG, XCG, a wire $XLWL_i$ for selecting the word lines $XLW_i$ and a wire $XLBL_j$ for access to the bit lines $LBL_j$. The two memories are parallel-connected, each wire $LWL_i$ for selecting a word line of the memory MEM being connected to a wire $XLWL_i$ for selecting a word line of the same rank i of the memory XMEM1. The selection wires $LWL_i$ are controlled by outputs $S_i$ of an address ADR decoder DEC1 by means of latches 11-i. Conventionally, these latches 11-i convert low voltage signals Vcc delivered by the outputs $S_i$ of the decoder DEC1 into high voltage signals Vpp for selecting the word lines $WL_i$ and $XWL_i$ during programming and erasure operations.

Here, each latch 11-i comprises a cutoff transistor 12, whose gate is controlled by an enabling signal Vx, and two inverter gates 13, 14 supplied by the voltage Vpp. Each switch 12 is arranged between an output $S_i$ of the decoder DEC1 and the input of the inverter gate 13. The output of each gate 13 is applied to the input of the gate 14. The output of each gate 14 is brought to the input of the gate 13 and is connected to a wire $LWL_i$ of the memory MEM.

The bits $B_j$ of a binary word BW to be recorded in the memory MEM are applied to the inputs $IN_j$ of a register REG1. The register REG1 comprises outputs $OUT_j$ connected to the wires $LBL_j$ of the bit lines $BL_j$ of the memory MEM and of the outputs $XOUT_j$ connected to the wires $XLBL_j$ of the bit lines $XBL_j$ of the memory XMEM1. The outputs $OUT_j$ of the register REG1 are enabled by a signal WRT and the outputs $XOUT_j$ are enabled by a signal XWRT. A signal RST is used to erase the registers REG1.

Figure 3:
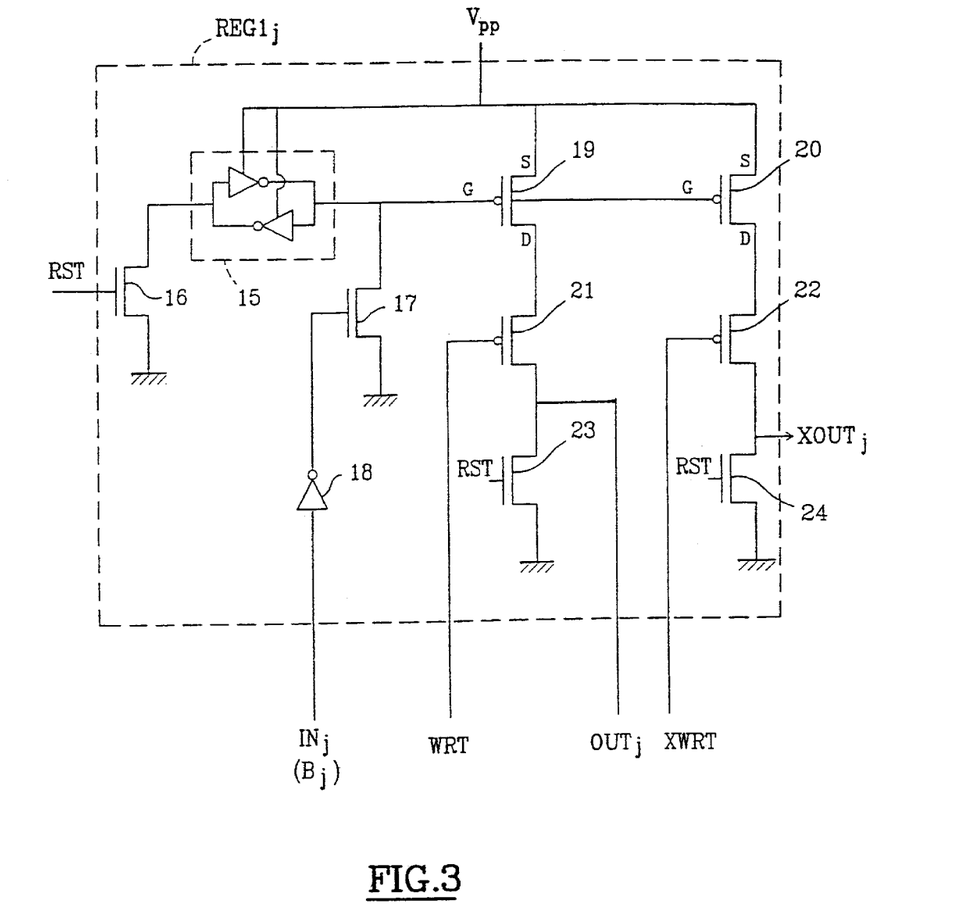
FIG. 3 is a detailed electrical diagram of an element of the system of FIG. 2.

FIG. 3 shows a j-ranking element $REG1_j$ of the register REG1, comprising an input $IN_j$, an output $OUT_j$ and an output $XOUT_j$. The element $REG1_j$ comprises an inverter flip-flop circuit 15 supplied with the voltage Vpp. The input of the flip-flop circuit 15 may be set at 0 by an NMOS transistor 16 driven by the signal RST. The output of the flip-flop circuit 15 may be set at 0 by an NMOS transistor 17 driven by the input $IN_j$ by means of an inverter gate 18. The output of the flip-flop circuit 15 drives two PMOS transistors 19, 20 supplied by the voltage Vpp. The drain D of the transistor 19 is connected to the output $OUT_j$ by means of a PMOS cutoff transistor 21 driven by the signal WRT. The drain D of the transistor 20 is connected to the output $XOUT_j$ by means of a PMOS cutoff transistor 22 driven by the signal XWRT. It is possible to provide for NMOS transistors 23, 24 driven by the signal RST to discharge the nodes of the outputs $OUT_j$ and $XOUT_j$ of the voltage Vpp.

The element $REG1_j$ works as follows. The output of the flip-flop circuit 15 is set at 0 when a bit $B_j$ equal to 0 is applied to the input $IN_j$. In this case, the output $OUT_j$ delivers the voltage Vpp if the signal WRT is at 0 and the output $XOUT_j$ delivers the voltage Vpp if the signal XWRT is at 0. When the signals WRT and XWRT are at 1, the outputs $OUT_j$ and $XOUT_j$ are in the floating state, or the in state "HZ" (high impedance). Conversely, when a bit $B_j$ at 0 is applied to the input $IN_j$ after erasure of the element $REG1_j$ by means of the signal RST, the output of the flip-flop circuit 15 delivers the voltage Vpp (logic "1") and the PMOS transistors 19, 20 are off. In this case, the outputs $OUT_j$ and $XOUT_j$ are floating whatever the value of the signals WRT and XWRT.

The system 10 according to the invention works in two steps which shall now be described with reference to FIG. 2.

Step ERAMEM

This step comprises the following operations: the register REG1 is erased by the signal RST, the bits $B_j$ of the binary word BW to be recorded are applied to the inputs $IN_j$. The signal XWRT is set at 0 (the enabling of the outputs $XOUT_j$) and the signal WRT is left at 1. The wires $XLBL_j$ of the memory XMEM1 that are connected to the output $XOUT_j$ of an element REG1 that has received a bit $B_j$ with a value 0 at its input $IN_j$ receive the voltage Vpp. The other wires $XLBL_j$ are at a floating potential. All the wires $LBL_j$ of the memory MEM are at a floating potential, the signal WRT being at 1. The signal Vx is applied to the latches 11-i so that the voltage Vpp is applied to a wire $LWL_i$ of the memory MEM, selected by the decoder DEC1 as a function of the address ADR received. The wire $XLWL_i$ of the memory XMEM1 which is connected to the wire $LWL_i$ also receives the voltage Vpp. Furthermore, the control wires XCG and AG are connected to the ground, the wire XAG is left floating and the voltage Vpp is applied to the wire CG.

During this step, the word line $WL_i$ of the memory MEM selected by the address ADR is erased. Simultaneously, the binary word BW is registered in the corresponding word line $XWL_i$ of the auxiliary memory XMEM1 by the programming at 0 of certain cells of this line. In order that this step may be done accurately, it is assumed that the word line $XWL_i$ has been erased beforehand.

Step PGRMEM

This step is the reverse of the previous step. The memory MEM is configured as the memory XMEM1 was configured in the previous state, and vice versa. In particular, the signal WRT is set at 0 and the signal XWRT is set at 1, the wires CG and XAG are connected to the ground, the wire AG is left floating and the voltage Vpp is applied to the wire XCG. The wires $LBL_j$ of the memory MEM corresponding to bits $B_j$ with a value 0 receive the voltage Vpp by the outputs $OUT_j$ of the register REG1. The other wires $LBL_j$ of the memory MEM are taken to a floating potential, along with all the wires $XLBL_j$ of the memory XMEM1.

During this second step, the word line $XWL_i$ of the memory XMEM1, containing the binary word BW, is erased. Simultaneously, the binary word BW is recorded in the selected word line $WL_i$ of the memory MEM by the programming at 0 of certain cells of this line. This step is done accurately since the selected word line $WL_i$ of the memory MEM has been erased during the previous step. Furthermore, advantageously, the erasure of the word line $XWL_i$ makes it possible to ensure that this line can receive a new word to be recorded during a subsequent step ERAMEM.

This method, which consists in recording a word in an auxiliary memory during the erasure of the main memory and then in erasing the auxiliary memory during the recording of the word in the main memory, provides efficient protection against cuts in the supply voltage Vcc and the programming voltage Vpp that occur between these two steps.

Thus, when the system 10 is powered on, the auxiliary memory XMEM1 which should contain only erased word lines is read. In other words, all the bits of the memory XMEM1 must be at "1". If a word line of the memory XMEM1 contains bits in the program state, namely at "0", this means that a power cut has taken place between the step ERAMEM and the step PGRMEM. In this case, the word contained in the auxiliary memory XMEM1 is loaded into the register REG1 and the step PRGMEM is activated. For the sake of the simplicity and clarity of the figures, the various internal connections and the various circuits used to read the memories MEM and XMEM1, which are known to those skilled in the art, have not been described and shown.

The method of the invention can be performed automatically by any microprocessor or wired-logic type of integrated circuit. The steps ERAMEM and PGRMEM as well as the step of verifying the contents of the auxiliary memory XMEM1 when the power is turned on can be managed by a microprocessor or by a wired-logic sequencer SEQ1 shown in FIG. 2. This sequencer which has a simple structure within the scope of those skilled in the art delivers the signals Vx, RST, WRT, XWRT, SVpp, SAG, SCG, SXAG, SXCG needed for the performance of the two steps. The signal SVpp is a signal for the activation of a standard type of step-up transformer circuit producing the high voltage Vpp (not shown). The signals SAG, SCG, SXAG, SXCG are signals for driving transistors (not shown) conventionally enabling the connection of the wires AG, CG, XAG and XCG to the ground or to the voltage Vpp, or allowing them to be floating.

Furthermore, a variant of the method of the invention consists of the use of the memories MEM and XMEM1 in tandem, namely alternately, for the permanent storage of the data. In this case, before each new registration of a data element, a step is performed to ascertain which one of the two memories MEM, XMEM1 has, at the address ADR sent to the decoder DEC1, a word line in the erased state capable of receiving the data. Then, the step PGRMEM or the step ERAMEM is activated depending on whether the data element must be recorded in the memory MEM or XMEM1. The determining of the memory MEM or XMEM1 having a word line erased at the address ADR may consist of a simple operation for the individual reading of the two memories. It is also possible to associate, with each word line, a warning cell $CEL_i$ of the type described further below. The binary word is then registered automatically in the word line whose warning cell is programmed (erased line). Simultaneously, the other word line is erased and its warning cell is programmed, in anticipation of the subsequent recording of a new binary word.

In this alternative embodiment, where the data elements are, without distinction, in either of the memories MEM and XMEM1, the two memories may be read simultaneously in parallel. Indeed, a memory cell at 1 (erased) is off and a memory cell at 0 (programmed) is on. The "0" therefore has priority over the "1" in parallel reading. Furthermore, among two word lines of the same address ADR, one line is always in the erased state (with all the bits at 1) by virtue of the method of the invention. Thus, the simultaneous reading of two word lines in the memories MEM and XMEM1 gives the binary word contained in the line that is not erased. This simultaneous and parallel reading of two word lines can also be done logically by sending the same-ranking bits contained in the two word lines, two by two, in the AND gates.

With a view to simplicity, the description has been limited here to a structure of memories MEM and XMEM1 comprising nine cells. It is clear that, in practice, the present invention can be applied to large-sized memories comprising, for example, a large number of word lines of 8 or 16 bits each.

From this viewpoint, the embodiment that has just been described may require a major silicon surface area because designing an auxiliary memory XMEM1 of the same size as the memory MEM leads to doubling the size of the memory array.

Hence, a description shall now be given of a second embodiment of the invention in which the size of the auxiliary memory is reduced to the strict minimum.

Second Embodiment of the Invention

Figure 4:
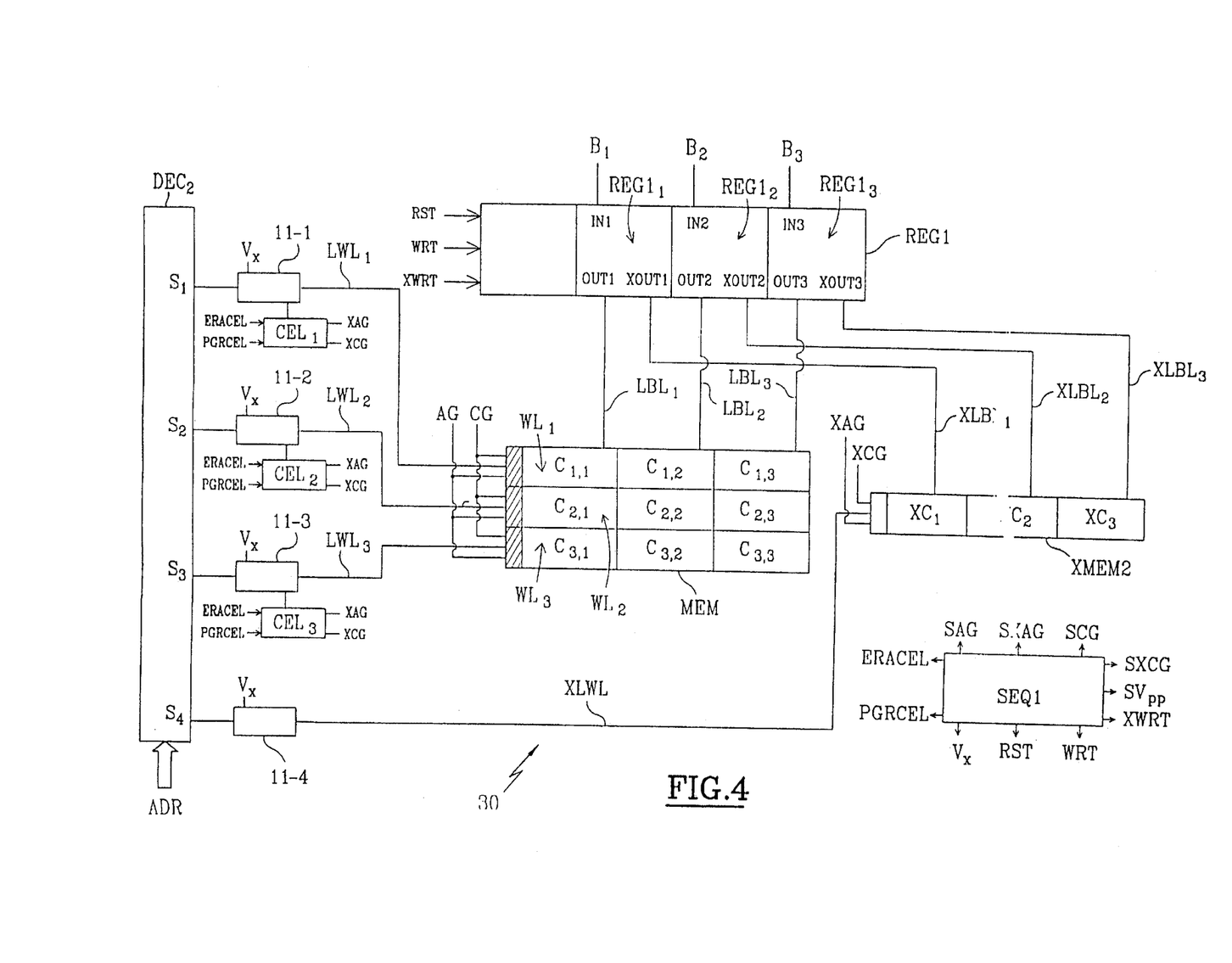
FIG. 4 is an electrical diagram of a second embodiment of the EEPROM system according to the invention.

FIG. 4 shows a system 30 according to the invention comprising an auxiliary memory XMEM2 that comprises only one word line XWL ($XWL_{i=1}$), access wires $XLBL_j$, two control wires XAG, XCG and one selection wire XLWL. The memory MEM and the register REG1 described further above are kept. The wire XLWL for the selection/activation of the word line XWL is driven by an output $S_4$ of a decoder DEC2 by means of a latch 11-4 similar to the latches 11-i described further above. As above, the decoder DEC2 comprises outputs $S_i$ connected to the wires $LWL_i$ of the memory MEM by means of latches 11-i.

According to the invention, each word line $WL_i$ of the memory MEM is equipped with an electrically erasable and programmable warning cell $CEL_i$ that is programmed when the word line is erased and erased when the word line is programmed.

The steps ERAMEM and PGRMEM take place as explained here above and shall not be described again. The only difference is that the output S4 of the decoder DEC2 is activated during the running of the two steps, a signal PGRCEL is generated during the step ERAMEM and a signal ERACEL is generated during the step PGRMEM. The signal PRGCEL is applied to all the cells $CEL_i$ and enables the programming of the cell $CEL_i$ of the word line $WL_i$ during erasure. The signal ERACEL is applied to all the cells $CEL_i$ and enables the erasure of the cells $CEL_i$ of the word line $WL_i$ during programming. The signals PRGCEL and ERACEL are for example delivered by the sequencer SEQ1 which has already been described.

Figure 5:
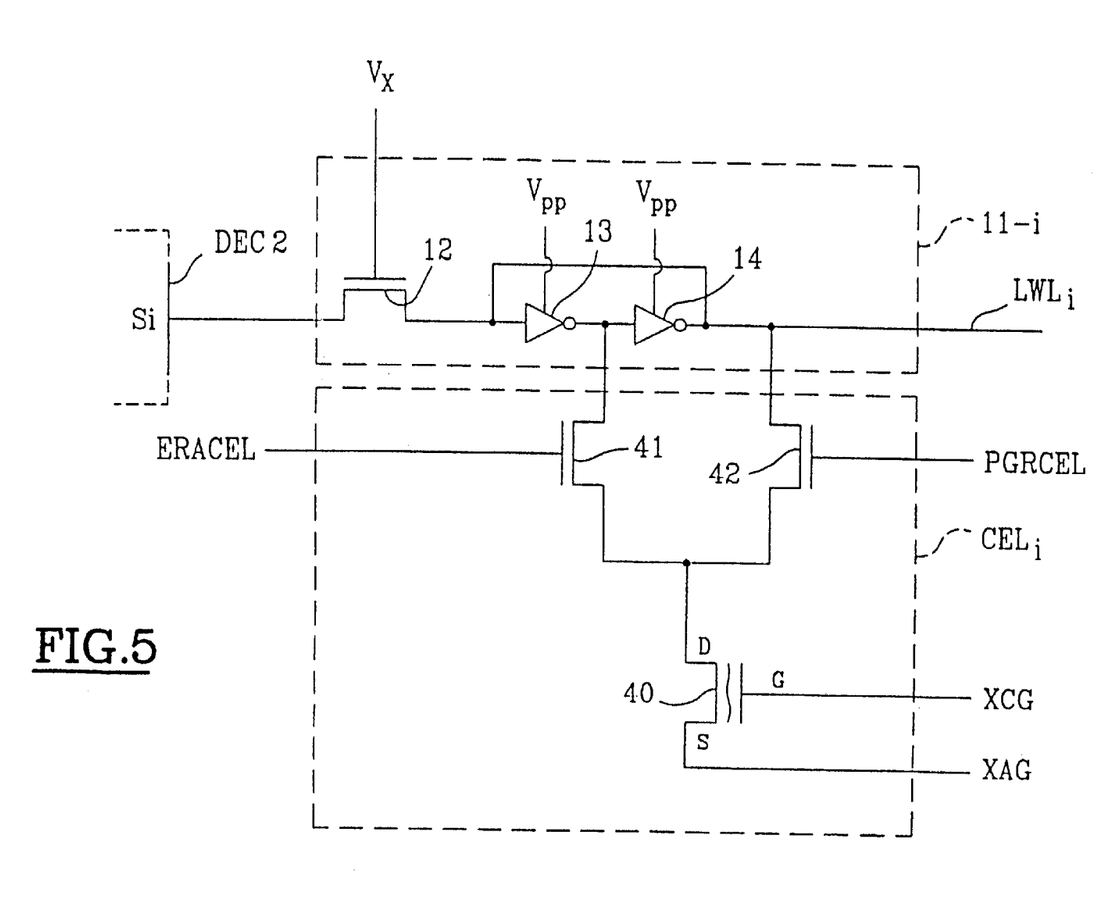
FIG. 5 is an electrical diagram of warning cells according to the invention, shown in a block diagram in FIG. 4.

FIG. 5 shows an exemplary embodiment of a warning cell $CEL_i$. The cell $CEL_i$ comprises a floating-gate transistor 40 whose gate G and source S are connected respectively to the wire XCG and the wire XAG of the auxiliary memory XMEM2. The drain D of the transistor 40 is connected by means of an NMOS transistor 41 to the output of the inverter gate 13 of a latch 11-i (and therefore to the input of the inverter gate 14 in series with the gate 13). The drain D of the transistor 40 is also connected by means of an NMOS transistor 42 to the output of the inverter gate 14 of the latch 11-i. The transistor 41 receives the erasure signal ERACEL at its gate and the transistor 42 receives the programming signal PGRCEL at its gate. In general, each warning cell $CEL_i$ of each word line $WL_i$ is connected in the manner just described to the latch 11-i which controls the wire $LWL_i$ for selecting the word line $WL_i$.

Thus, during the step ERAMEM, when a latch 11-i is activated by the passage to the value 1 of an output $S_i$ of the decoder DEC2, the output of the inverter gate 14 of the latch 11-i delivers the voltage Vpp. Simultaneously, the signal PRGCEL is applied to the transistor 42 and the drain D of the floating-gate transistor 40 receives the voltage Vpp. Simultaneously again, the gate G of the transistor is connected to the ground by the control wire XCG and the source S of the transistor 40 is taken to a floating potential by the wire XAG (the auxiliary memory XMEM2 being in the course of being programmed for the recording of a word). Electrical charges are liberated from the floating gate of the transistor 40 and the cell $CEL_i$ goes into the programmed state.

During the next step PRGMEM, the latch 11-i is still activated and the output of the inverter gate 13 of the latch 11-i is at the ground (logic "0"). The signal ERACEL is applied to the transistor 41 and the drain D of the floating-gate transistor 40 gets connected to the ground. At the same time, the gate G of the transistor 40 receives the voltage Vpp through the control wire XCG and its source S is connected to the ground by the wire XAG (the auxiliary memory XMEM2 being in the course of being erased). The electrical charges are injected into the floating gate of the transistor 40 and the cell $CEL_i$ goes into the erased state.

Apart from these characteristics, the warning cells $CEL_i$ according to the invention advantageously enable the automatic selection of a word line $WL_i$ to be programmed if a supply cutoff has taken place before the step PRGCEL is performed. It is therefore not necessary to read the warning cells to recover the word line $WL_i$ to be programmed.

Thus, when the system 30 is powered on, first of all the memory XMEM2 is read. If the auxiliary memory is not erased, the word that it contains is loaded into the register REG1 and the step PGRMEM is launched. At this time, only the output $S_4$ of the decoder DEC2 is activated for the erasure of the memory XMEM2, because it is not known which is the word line $WL_i$ of the memory MEM that must receive the binary word. To prevent any random activation of the latches 11-i (the gates 13 and 14 being arranged in a closed loop), the outputs $S_i$ of the decoder DEC2 (except for $S_4$) are set at zero and the signal Vx is applied in a transient manner. With the signal ERACEL being applied to all the warning cells $CEL_i$, the drains D of all the transistors 40 of the cells $CEL_i$ are connected to the output of the inverter gate 13 of the corresponding latch 11-i, namely the input of the inverter gate 14 (see FIG. 5). Among the warning cells, one cell is in the programmed state owing to the power cut. The transistor 40 of this cell $CEL_i$ is naturally on so that the input of the inverter gate 14 of the corresponding latch 11-i is set at 0 through the transistors 40, 41. The output of the inverter gate 14 goes to 1 and sends the voltage Vpp into the selection wire $LWL_i$ to which it is connected. The corresponding word line $WL_i$ is therefore automatically activated. In the moments that follow, the cell $CEL_i$ is erased as described further above and the transistor 40 is no longer on. The signal ERACEL is applied to the beginning of the step PRGMEM so that the word line $WL_i$ to be programmed is selected by the cell $CEL_i$ before it gets erased. Since the inverter gates 13 and 14 of the latches 11-i form a memory inverter, a 0 pulse at the input of the gate 14 before the warning cell gets erased is enough to obtain the result of the invention, namely the selection and activation of the line to be programmed.

Here above, two embodiments have been described of a memory system according to the invention. Various other embodiments of the invention can be envisaged using a combination of the two embodiments described.

For example, if warning cells $CEL_i$ are added to the memories MEM, XMEM1 of the system 10 of FIG. 2, a part of the auxiliary memory XMEM1 can be used as a main memory. In this case, a line of the main memory MEM must be reserved as an auxiliary memory of the part of the auxiliary memory XMEM1 used as a main memory. In short, this combined embodiment consists in planning for two memories MEM1 and MEM2. Each memory contains a "main memory" part and an "auxiliary memory" part that is auxiliary to the main part of the other memory. The auxiliary parts of each memory can include only one word line at a reserved address. This embodiment enables the storage of the data elements in both memories and the duplication of the storage capacity of the system.

Furthermore, the fields of application of the present invention are very extensive and also relate to the data counters, for example the counters of units present in the chip cards. Hereinafter, two exemplary counters made according to the principle of the invention shall be described.

Application of the Invention to the Making of a Secured Abacus Type Counter

The following table illustrates the operation of a standard abacus type counter and describes an operation of decrementing such a counter. The counter herein comprises four lines $L_1$ to $L_4$ with increasing place values comprising bits having the same place values. The bits at 1 of the line $L_1$ have for example a place value equal to 1, the bits at 1 of the line $L_2$ have a place value equal to 9, the bits at 1 at the line $L_3$ have a place value equal to 73, and the bits at 1 of the line $L_4$ have a place value equal to 585. In the initial state, the value of the counter is 1755 (3×585) and, in the next state, the counter is decremented by one unit, its value being 1754 (2×585+8×73).

| | Initial state | | | | | | | |
|---|---|---|---|---|---|---|---|---|
| L4 | 1 | 1 | 1 | 0 | 0 | 0 | 0 | 0 |
| L3 | 0 | 0 | 0 | 0 | 0 | 0 | 0 | 0 |
| L2 | 0 | 0 | 0 | 0 | 0 | 0 | 0 | 0 |
| L1 | 0 | 0 | 0 | 0 | 0 | 0 | 0 | 0 |
| | Following state | | | | | | | |
| L4 | 1 | 1 | 0 | 0 | 0 | 0 | 0 | 0 |
| L3 | 1 | 1 | 1 | 1 | 1 | 1 | 1 | 1 |
| L2 | 0 | 0 | 0 | 0 | 0 | 0 | 0 | 0 |
| L1 | 0 | 0 | 0 | 0 | 0 | 0 | 0 | 0 |

This example shows that the programming at 0 of a bit of a most significant line must be followed, in an abacus counter, by the total erasure of the line with the immediately lower place value. In the prior art, if a cut in the power supply voltage takes place after the programming at 0 of a bit of a most significant line and before the erasure of the line with a lower place value, the counter shows a wrong value. In the above example, this wrong value would be 1170 (2×585).

Figure 6:
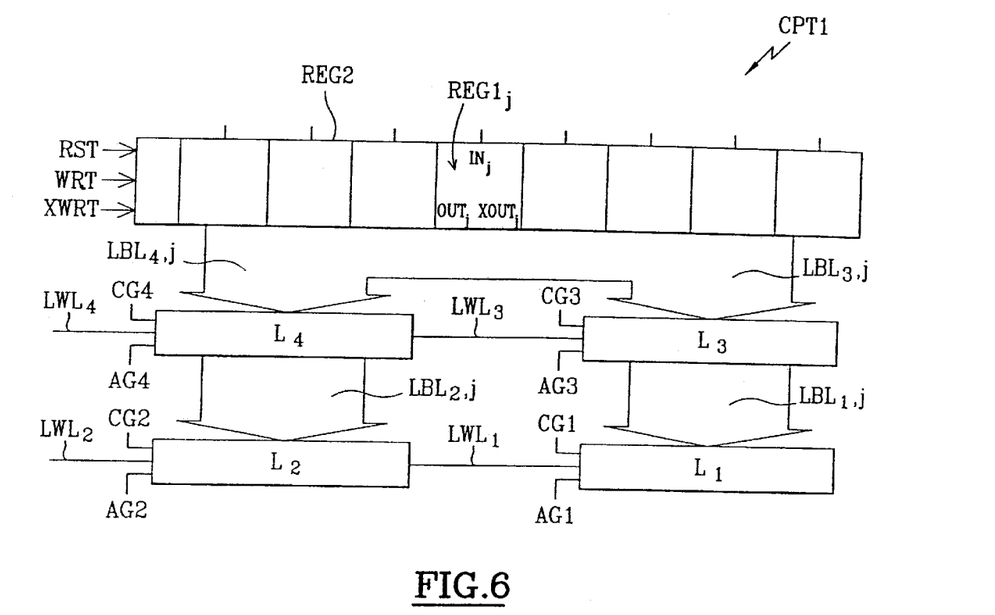
FIG. 6 is an electrical diagram of an abacus type counter according to the invention.

FIG. 6 shows an abacus counter CPT1 that does not have this drawback. The counter CPT1 has four counting lines $L_1$, $L_2$, $L_3$, $L_4$ with increasing place values and a register REG2. Each line $L_k$ has for example eight electrically erasable and programmable cells to record an abacus type counting data element $AV_k$, as well as one control wire $CG_k$, one control wire $AG_k$, access wires $LBL_{k,j}$ and a selection wire $LWL_k$ (k being an index designating the rank of each counting line). The register REG2 is similar in its structure to the register REG1 already described but herein comprises eight elements $REG1_j$.

According to the invention, the lines $L_k$ are arranged so that each line can be programmed and/or erased independently of the immediately lower ranking line. More particularly, the lines $L_4$ and $L_3$, and $L_2$ and $L_1$ respectively are arranged in parallel, the control wires $LWL_4$ and $LWL_3$ and $LWL_2$ and $LWL_1$ respectively being connected together. The lines $L_4$ and $L_2$ are arranged in series, each access wire $LBL_{4,j}$ being connected to an access wire $LBL_{2,j}$ of the same rank j as well as an output $OUT_j$ of the register REG2. The lines $L_3$ and $L_1$ are also arranged in series, each access wire $LBL_{3,j}$ being connected to an access wire $LBL_{1,j}$ of the same rank j as well as to an output $XOUT_j$ of the register REG2.

According to the invention, when a bit of a line $L_i$ (except for the line $L_1$ with the lowest place value) is programmed at 0, the line with a lower rank $L_{i-1}$ is simultaneously erased. The advantages of the invention herein relate to the fact that the operations for writing and erasing two neighboring lines are done simultaneously.

For example, the operation of decrementing in the above table is done according to the following steps (assuming that the line $L_4$ contains the value "11100000" and that the line $L_3$ contains the value "00000000":

1) the loading of the word "11011111" into the register REG2 (for an individual programming at 0 of the third bit of the line $L_4$), 2) the enabling of the outputs $OUT_j$ of the register REG2 and the disabling of the outputs $XOUT_j$: the signal WRT is set at 0 and the signal XWRT is left at 1, and 3) the configuration of the control wires of the counter CPT1: $CG_4=0$, $LWL_4=Vpp$, $AG_4=HZ$ (floating), $CG_3=Vpp$, $AG_3=0$.

These steps are done almost simultaneously. Then, the line $L_4$ contains the value "11000000" and the line $L_3$ which is erased contains the value "11111111".

The counter CPT1 that has just been described is particularly well suited to telephone card type applications where the units are counted out unit by unit.

However, in certain applications, the counters are decremented or incremented by jumps in value. The counter CPT1 is ill-suited to such jumps in value because, in this case, several words have to be registered simultaneously in several counting lines. These lines must first of all be erased and then programmed, so much so that we are back with the drawbacks of the prior art.

To overcome this drawback, the present invention proposes to make a secured binary counter that works according to the principle of the invention.

Application of the Invention to the Making of a Secured Binary counter

Conventionally, a binary counter is a counter in which the counting data is stored in a counting line in the form of a binary word comprising bits with place values increasing by powers of two: 1, 2, 4, 8, 16, 32, 64, 128, .... The binary counters are generally not used in chip cards or equivalent devices because a power voltage cut that takes place after the erasure of the counting line and before the recording of a new counting data element would lead to a loss of the totality of the value of the counter.

Figure 7:
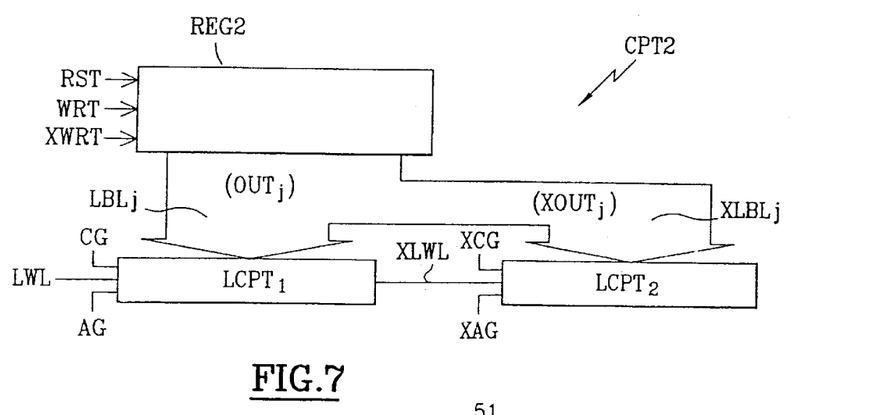
FIG. 7 is an electrical diagram of a binary counter according to the invention.

FIG. 7 shows a secured binary counter CPT2 that does not have this drawback. The counter has two counting lines $LCPT_1$, $LCTP_2$ in parallel that are programmable and erasable electrically by means of the register REG2 described further above. Each line $LCPT_1$, $LCPT_2$ comprises one and the same number of bits, for example 8 or 16 bits, chosen as a function of the capacity to be given to the counter.

For the sake of simplicity, the counter CPT2 is shown schematically in the figure because its structure has been implicitly described here before. Thus, the structure of the counter CPT2 is the one shown by the counter CPT1 of FIG. 6 when the lines $L_1$ and $L_2$, or $L_3$ and $L_4$ are eliminated. Also, the structure of the counter CPT2 is that of the system 30 of FIG. 4 when the memory MEM has only one word line $WL_i$ (the cells $CEL_i$ being no longer necessary), the memory MEM forming the counting line $LCPT_1$ and the auxiliary memory XMEM2 forming the counting line $LCPT_2$.

Here, it is not both the steps ERAMEM and PRGMEM that are activated for recording a counting data element but only one of these steps, the two lines $LCPT_1$ and $LCPT_2$ working in tandem. Thus, each new binary counting data element BV is recorded alternately in one of the counting lines $LCPT_1$, $LCPT_2$. When a new counting data element BV has to be recorded, a search is made, among the two counting lines, for the one that is in the erased state. The new counting data element is recorded in this line and, simultaneously, the other counting line is erased (during an initialization step, it is possible to record an initial data element in one of the lines $LCPT_1$, $LCPT_2$ and erase the other line). The step of recording the counting data element is equivalent to the step ERAMEM or the step PRGMEM depending on whether the line that is found to be erased is the line $LCPT_2$ or the line $LCPT_1$. A sequencer of the type described further above may be planned.

The counting data element BV may also be read in a single step by the parallel and simultaneous reading of the two lines $LCPT_1$, $LCPT_2$ according to a principle already described.

Figure 8:
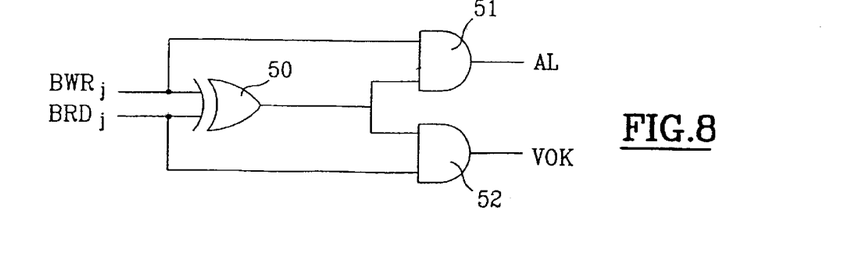
FIG. 8 is a logic diagram of an element for the verification of the counter of FIG. 7.

Finally, the reading of a new counting data element in the counter CPT2 is preferably subject to the condition that the new counting data element should be smaller or greater than the previously recorded counting data element, in an authorized sense of modification of the counter. FIG. 8 shows that the verification of this condition can be done by means of a wired logic circuit. In this example, the bits $BWR_j$ of the counting data element to be registered are compared with the same-ranking bits $BRD_j$ of the previously recorded counting data element, beginning with the most significant bits. More particularly, an XOR gate 50 receives the bits $BWR_j$ and $BRD_j$ at input, an AND gate 51 receives the output of the gate 50 and the bits $BRW_j$ at input, and an AND gate 52 receives the output of the gate 50 and the bits $BRD_j$ at input. When the output bit of the gate 51 goes to 1, it is considered to be an alarm signal AL. The recording operation is not performed. Conversely, when the output bit of the gate 52 goes to 1, it is considered to be an authorization signal VOK. In this example, the counter changes in the decreasing sense. The recording of the new counting data element is permitted only on condition that the bit at 1 of the first pair of bits {$BRW_j$, $BRD_j$} encountered that comprises two bits of different values is the bit $BRD_j$.

Here, the step of recording a new counting data element in an erased line of the counter and the step of erasing the other counting line may be done one after the other instead of being done simultaneously. Indeed, the only consequence of an electrical supply cut between the recording of the counting value in one line and the erasure of the other line is that the counter, when it is powered on, has two counting values. Since the counter has a predetermined sense (either incrementation or decrementation) of modification, it is easy to identify the last counting data element recorded (by a separate reading of the two counting lines) and then erase the line comprising the oldest counting data element. The last counting data element recorded is the one with the highest or the lowest value in the authorized sense of modification of the counter. Thus, when a counting data element has to be recorded and, more generally, when the data element to be recorded is one that is always changing the same sense or according to a predetermined law, it is not imperative to perform the recording and erasure steps simultaneously. What is essential is that a counting line in the erased step should be available when the new counting data element is recorded. From this viewpoint, the splitting up in time of the two steps of recording and erasure can also be envisaged in the case of the memory system 10 described further above, provided that each binary word recorded contains an indication, for example a date, making it possible to ascertain which of two binary words of the same address ADR in the memories MEM and XMEM1 is the last recorded word.

Here above, a description has been given of various alternative modes of performing the recording method and various embodiments of the memory system according to the invention. It will clearly be seen by those skilled in the art that other embodiments can be envisaged. For example, the system 30 of FIG. 4 may comprise an auxiliary memory XMEM2 comprising a number of word lines $XWL_i$ greater than 1 but smaller than the number of word lines $WL_i$ of the main memory MEM. Since floating-gate transistors show aging in proportion to the number of programming and erasure cycles that they undergo, this alternative embodiment makes it possible to delay the aging of the auxiliary memory XMEM2. In this case, the choice of the auxiliary word line $XWL_i$ for the performance of the steps ERAMEM and PGRMEM may be random or cyclical. This makes it possible to distribute the aging in an equiprobable way over all the lines of the memory.

Furthermore, an alternative embodiment such as this may make it possible to integrate the counter CPT2 of FIG. 7 into the system 30 of FIG. 4. In this case, a word line $WL_i$ of the memory MEM is reserved as a counting line $LCPT_1$, and a word line $WL_i$ of the auxiliary memory XMEM2 is reserved as a counting line $LCPT_2$. Naturally, the counter CPT2 can also be integrated into the system 10 of FIG. 2.

Finally, those skilled in the art will note that the present invention is designed to be combined with the invention described in the Application WO97/48100. As was already recalled in the preamble, this other invention makes it possible to continue an operation of programming or erasing a word line in the event of a cut in the supply voltage Vcc. The present invention supplements this previous invention and makes it possible to prevent the loss of a data element to be recorded by means of an immediate recording of the data element in a line that has been erased beforehand. Together, these two inventions make it possible to set up a secured EEPROM system that is entirely protected against power supply cuts.

What is claimed is:

1. Method for recording a binary word (BW) in a memory (30, CPT1, CPT2) comprising electrically erasable and programmable memory cells ($C_{i,j}$) organized in word lines (WL, XWL), characterized in that the word lines are organized to form a main memory zone (MEM) and an auxiliary memory zone (XMEM2) in parallel with the main memory zone, the auxiliary memory zone comprising a number of word lines (XWM) smaller than the number of word lines ($Wl_i$) of the main memory zone, and in that it comprises:

a first recording step comprising the steps of selecting a word line ($Wl_i$) in the main memory zone (MEM), selecting an auxiliary word line (XWL) in the auxiliary memory zone, recording the binary word in the auxiliary word line (XWL) and simultaneously erasing the word line ($Wl_i$) selected in the main memory zone, and a second recording step comprising the steps of recording the binary word in the erased word line ($Wl_i$) selected in the main memory zone and simultaneously erasing the auxiliary word line (XWL).

2. Method according to claim 1, wherein:

an electrically erasable and programmable warning cell ($CEL_i$) is associated with each of the word lines ($Wl_i$) of the main memory zone (MEM), the warning cell ($CEL_i$) of a word line ($Wl_i$) of the main memory zone is erased when the word line is programmed, and the warning cell ($CEL_i$) of a word line ($Wl_i$) of the main memory zone is programmed when the word line is erased.

3. Memory (30) comprising word lines ($Wl_i$) arranged in such a way as to form a first memory zone and a second memory zone in parallel, and means for writing a binary word (BW) arranged for selecting, upon reception of a signal for writing the binary word, a word line in one of the memory zones and recording the binary word in the selected word line, characterized in that:

the first memory zone is a main memory zone (MEM) that is accessible line by line by the application of an address (ADR) to an address decoder (DEC2), the second memory zone is an auxiliary memory zone (XMEM2) comprising a number of word lines (XWM) smaller than the number of word lines ($Wl_i$) of the main memory zone (MEM), the number of word lines of the auxiliary memory zone being at least equal to 1.

4. Memory according to claim 3, characterized in that the writing means (SEQ1, REG1) are arranged to:

first of all, record the binary word in an auxiliary word line (XWL) of the auxiliary memory zone (XMEM2) and simultaneously erase a word line ($Wl_i$) selected in the main memory zone (MEM), then record the binary word in the selected word line (Wl$_i$) of the main memory zone and simultaneously erase the auxiliary word line (XWL).

5. Memory according to claim 4, comprising:

electrically erasable and programmable warning cells (CEL$_i$) associated with the word lines (Wl$_i$) of the main memory zone (MEM), means (SEQ1, 40, 41, 42) for erasing the warning cell (CEL$_i$) of a word line (Wl$_i$) when the word line is programmed and programming the warning cell (CEL$_i$) of a word line (Wl$_i$) of the main memory zone when the word line is erased.

6. Memory according to claim 5, comprising means (DEC2, CEL$_i$) for automatically selecting a word line (Wl$_i$) whose warning cell (CEL$_i$) is not erased and the recording of a binary word in the selected word line when a programming voltage (Vpp) is applied to the memory.

7. Memory according to claim 3, comprising a binary counter (CPT2) for the storage of a counting data element (VB) characterized in that the counter comprises:

at least one first counting line (LCTP$_1$) in the main memory zone and at least one second counting line (LCTP$_2$) in the auxiliary memory zone, means (REG1, AG, XAG, CG, XCG) for recording each new counting data element (BV) alternately in the first (LCTP$_1$) or the second (LCTP$_2$) counting line and for simultaneously or subsequently erasing the counting line (LCTP$_1$, LCTP$_2$) comprising the former counting data element.

8. Memory according to claim 7, comprising means (50, 51, 52) for comparing each new recorded counting data element with a previously recorded counting data element, arranged to prevent the recording of the new counting data element if it is smaller or greater, according to a predetermined sense of modification of the counter, than the former counting data element.

9. Memory according to claim 8, wherein the comparison means (50, 51, 52) are arranged for a bit-by-bit comparison (BWR$_j$, BRD$_j$) of the new counting data element to be recorded with the previously recorded counting data element, starting with the most significant bits.

10. Memory according to claim 3, comprising an abacus counter (CPT1) for the storage of the binary words (AV$_k$) with increasing place values, comprising a plurality of electrically erasable and programmable counting lines (L$_k$) with increasing place values, arranged so that each line can be programmed or erased simultaneously with the erasure or programming of the counting line having the immediately lower place value and means (REG2, AG, XAG, CG, XCG, LWL) for recording a counting data element in a counting line (L$_k$) and simultaneously erasing the counting line (L$_k$) with the immediately lower place value.

11. Memory according to claim 10, wherein the word lines of the abacus counter are arranged in groups of parallel lines, each line of a given rank of a group of parallel lines being arranged in series with the same-ranking lines of the other groups.

* * * * *